(12) United States Patent
Becklin

(10) Patent No.: US 8,668,285 B2
(45) Date of Patent: Mar. 11, 2014

(54) SYSTEMS AND METHOD FOR SECURING ELECTRONICS EQUIPMENT

(75) Inventor: Dennis M. Becklin, Grants Pass, OR (US)

(73) Assignee: Becklin Holdings, Inc., Reno, NV (US)

( * ) Notice: Subject to any disclaimer, the term of this patent is extended or adjusted under 35 U.S.C. 154(b) by 498 days.

(21) Appl. No.: 12/191,183

(22) Filed: Aug. 13, 2008

(65) Prior Publication Data

US 2010/0038328 A1    Feb. 18, 2010

(51) Int. Cl.
*A47B 88/00* (2006.01)

(52) U.S. Cl.
USPC .............. 312/330.1; 312/333; 312/332.1; 108/143

(58) Field of Classification Search
USPC ........... 312/330.1, 333, 332.1, 334.6, 334.27, 312/334.44; 108/143; 384/21
See application file for complete search history.

(56) References Cited

U.S. PATENT DOCUMENTS

| | | | |
|---|---|---|---|
| 879,455 A | 2/1908 | Frost et al. | |
| 2,695,115 A | 11/1954 | Roop et al. | |
| 2,849,151 A | 8/1958 | Heil | |
| 2,939,603 A | 6/1960 | Young | |
| 3,103,278 A | 9/1963 | Kuzma et al. | |
| 3,117,692 A | 1/1964 | Carpenter et al. | |
| 3,383,009 A | 5/1968 | Weikert | |
| 3,391,824 A | 7/1968 | Wiseman | |
| 3,419,184 A | 12/1968 | Asenbauer | |
| 3,481,502 A | 12/1969 | Slayman | |
| 3,482,895 A * | 12/1969 | Becklin | 312/352 |
| 3,616,943 A | 11/1971 | Brink | |
| 3,754,645 A | 8/1973 | Kilroy | |
| 3,756,396 A | 9/1973 | Kilroy | |
| 3,759,416 A | 9/1973 | Constantine | |
| 3,811,747 A | 5/1974 | Levin | |
| 3,968,879 A | 7/1976 | Lucas, Sr. et al. | |
| 4,287,997 A | 9/1981 | Rolfe et al. | |
| 4,655,360 A | 4/1987 | Juhanson | |
| 4,671,411 A | 6/1987 | Rehrig et al. | |
| 4,765,252 A | 8/1988 | Shuert | |
| 4,832,200 A | 5/1989 | Deaton et al. | |
| 4,848,605 A | 7/1989 | Wise | |
| 5,042,674 A | 8/1991 | Ramsay et al. | |
| 5,160,357 A * | 11/1992 | Faber | 55/385.2 |
| D333,094 S | 2/1993 | Zutler | |
| 5,203,494 A | 4/1993 | Blomfield | |
| 5,392,945 A | 2/1995 | Syrek | |
| D361,715 S | 8/1995 | Haupert | |
| 5,454,477 A | 10/1995 | Bornhorst et al. | |
| 5,566,824 A | 10/1996 | Tack et al. | |
| 5,641,090 A | 6/1997 | Kowalski et al. | |
| 5,718,350 A | 2/1998 | Williams | |
| 5,769,230 A | 6/1998 | Koefelda | |
| 5,779,051 A | 7/1998 | Boutin | |

(Continued)

FOREIGN PATENT DOCUMENTS

EP    0129860    1/1985

*Primary Examiner* — Daniel Rohrhoff
(74) *Attorney, Agent, or Firm* — Lowe Graham Jones PLLC

(57) ABSTRACT

A system for a slide-out platform in a rack mount case includes a slide-out platform configured to secure electronic equipment. The platform is slideably attached to the rack mount case using a first rail and a second rail. The first and second rail have a series of indexing holes in order to allow a dagger pin to secure the platform in place.

13 Claims, 5 Drawing Sheets

(56) References Cited

U.S. PATENT DOCUMENTS

| | | | |
|---|---|---|---|
| 5,785,401 A * | 7/1998 | Bowyer et al. | 312/350 |
| 5,808,866 A * | 9/1998 | Porter | 361/695 |
| 5,992,956 A * | 11/1999 | Slivon | 312/334.25 |
| 6,021,916 A | 2/2000 | Stolzman | |
| 6,082,844 A * | 7/2000 | Hausler et al. | 312/283 |
| 6,085,467 A | 7/2000 | Packrall et al. | |
| 6,186,345 B1 | 2/2001 | Robertson | |
| 6,237,758 B1 | 5/2001 | Hsu | |
| D446,017 S | 8/2001 | Koefelda | |
| 6,308,858 B1 | 10/2001 | Koefelda | |
| 6,320,744 B1 * | 11/2001 | Sullivan et al. | 361/679.34 |
| 6,349,041 B1 * | 2/2002 | Hayward et al. | 361/818 |
| 6,367,630 B1 | 4/2002 | Elskamp | |
| 6,371,364 B1 | 4/2002 | Maillot et al. | |
| 6,457,599 B1 | 10/2002 | Apps et al. | |
| 6,460,818 B1 * | 10/2002 | Garelick et al. | 248/420 |
| 6,585,090 B2 | 7/2003 | Harvey | |
| 6,662,950 B1 | 12/2003 | Cleaver | |
| D500,924 S | 1/2005 | Martin et al. | |
| 6,859,363 B1 * | 2/2005 | Chuang | 361/679.34 |
| 7,163,122 B2 | 1/2007 | Elder et al. | |
| 7,688,584 B1 * | 3/2010 | Becklin | 361/694 |
| 7,762,750 B2 * | 7/2010 | Sprague et al. | 410/84 |
| 8,411,446 B2 * | 4/2013 | Becklin | 361/730 |
| 2004/0178208 A1 | 9/2004 | Leba et al. | |
| 2006/0254947 A1 | 11/2006 | Rogers | |
| 2006/0289470 A1 * | 12/2006 | Sprague et al. | 219/532 |

* cited by examiner

SYSTEMS AND METHOD FOR SECURING ELECTRONICS EQUIPMENT

BACKGROUND OF THE INVENTION

Transportation of precision electronic instrumentation generally requires bulky packaging to insulate the instruments from shock or vibration. After use, the instruments must be repacked for shipping. In many circumstances, particularly in military field use, it is desirable that the instruments be as protected as possible during temporary operation. Additionally, when instruments are used intermittently at different locations it is desirable that the instruments be quickly and easily readied for transportation.

A rack mount case provides a sturdy protective shell for installments mounted in a shock and vibration resistant carriage. The case permits installation of rack mount instrument units without modification and permits operation of the units without removal from the case. While rack mount cases are useful for transportation of electronic equipment, cases are frequently too heavy and cumbersome to move, particularly when only needed to transport one or a few pieces of electronic equipment.

SUMMARY OF THE INVENTION

Apparatus and method for slide-out platform electronics cases are disclosed herein. A system for a slide-out platform in a rack mount case includes a slide-out platform configured to secure electronic equipment. The platform is slideably attached to the rack mount case using first and second rails. The first and second rails have a series of indexing holes in order to allow a detent member, such as a dagger pin, to secure the platform in place with respect to the case.

In one example of the invention, a system for a slide-out platform in a rack mount case includes a slide-out platform configured to secure electronic equipment; a first rail and a second rail coupled to the rack mount case and configured to slideably engage the slide-out platform, the first and second rails each having a plurality of indexing holes; and at least one detent member coupled to the slide-out platform and movable for selected insertion into a desired indexing hole to substantially fix the slide-out platform relative to the case.

In another example of the invention, a system for a slide-out platform in a rack mount case includes means for attaching electronic equipment to the slideable platform in the rack mount case; means for slideably mounting the platform to the rack mount case; and means for securing the platform to the means for slideably mounting within the rack mount case.

BRIEF DESCRIPTION OF THE DRAWINGS

The preferred and alternative embodiments of the present invention are described in detail below with reference to the following drawings.

DETAILED DESCRIPTION OF THE PREFERRED EMBODIMENT

In one embodiment, an electronics case includes a slide-out platform that may take the form of a shock-mounted, composite, equipment platform. The platform is configured to slide out of the center body of the case. The slide-out platform may advantageously eliminate the weight and expense of a full rack mount inner frame in applications where the frame is underutilized as an electronic equipment mounting structure. The slide-out platform may be compression molded from fiber-reinforced composite materials embedded in a matrix, or may be made from other materials.

Figure 1:
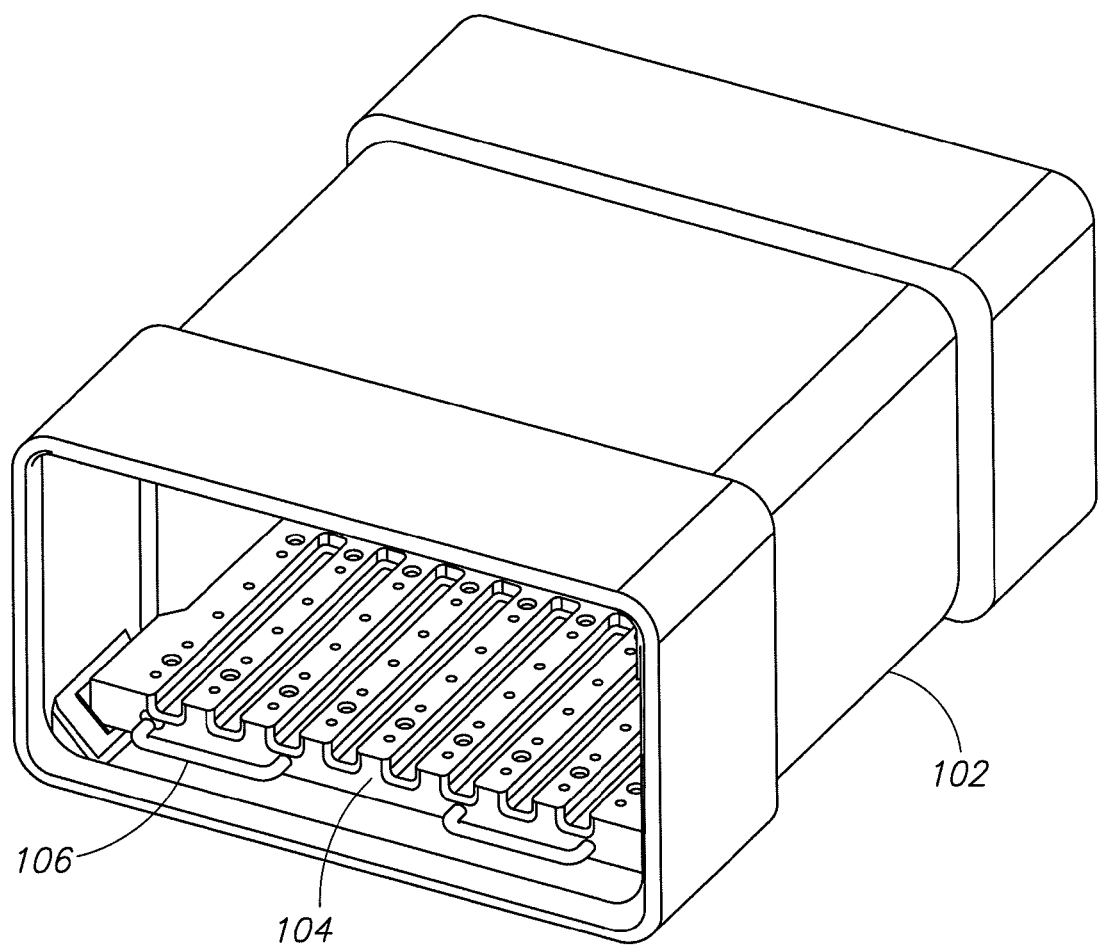
FIG. 1 shows a slide-out platform in a rack mount case in one embodiment.

FIG. 1 shows an exemplary slide-out platform 104 in a rack mount case 102 according to an embodiment of the invention. The rack mount case 102 is configured to hold the slide-out platform 104. The rack mount case is stackable with other cases and has a front and rear cover (not shown). FIG. 1 shows the front cover removed. The front and rear covers may be attached to the case 102 to prevent ingress of undesirable water, dust, chemical agents or other debris. In one embodiment, front and rear covers are attached to the case 102 with seals that are located around a peripheral edge of the case 102 and an engaging region of the front and rear covers. Compression of the seals may be accomplished with one or more latches used to couple the front and rear covers to the case 102. In addition, a pressure relief valve may be located in the case or in one or both of the covers to adjust an amount of internal in the case 102.

The case 102 may be configured in a variety of shapes and sizes. The case 102 is preferably constructed using compression molded shells comprised of a 40% continuous glass strand reinforced polypropylene material. Likewise, the platform 104 may be made from the same molding process and materials. In one embodiment, the platform 104 is approximately 24.17 inches in length by 19.23 inches in width. However, the length and width of the platform 104 may be varied to accommodate different applications and a variety of equipment heights.

The slide-out platform 104 has a series of openings or holes to enable the attachment of electronic equipment (not shown) to the platform. Equipment may be mounted onto the platform 104 with threaded fasteners, which preferably bolt into stainless steel nut-bars (not shown) installed beneath the platform 104 corresponding to the series of holes. In one embodiment, the platform may include additional holes to allow for direct bolting of equipment onto the platform 104, preferably from a bottom side of the platform 104. Equipment may also be strapped to the platform 104. In another embodiment, the equipment may be welded, glued, latched, clamped, hooked or otherwise coupled to the platform 104. The platform 104 preferably contains at least one pull out handle 106. In a preferred embodiment, the pull out handles 106 are spring loaded and configurable to activate dagger pins 108 (FIG. 2) that are received in the openings. Biasing members 120 attach each handle 106 to the platform 104.

Figure 2:
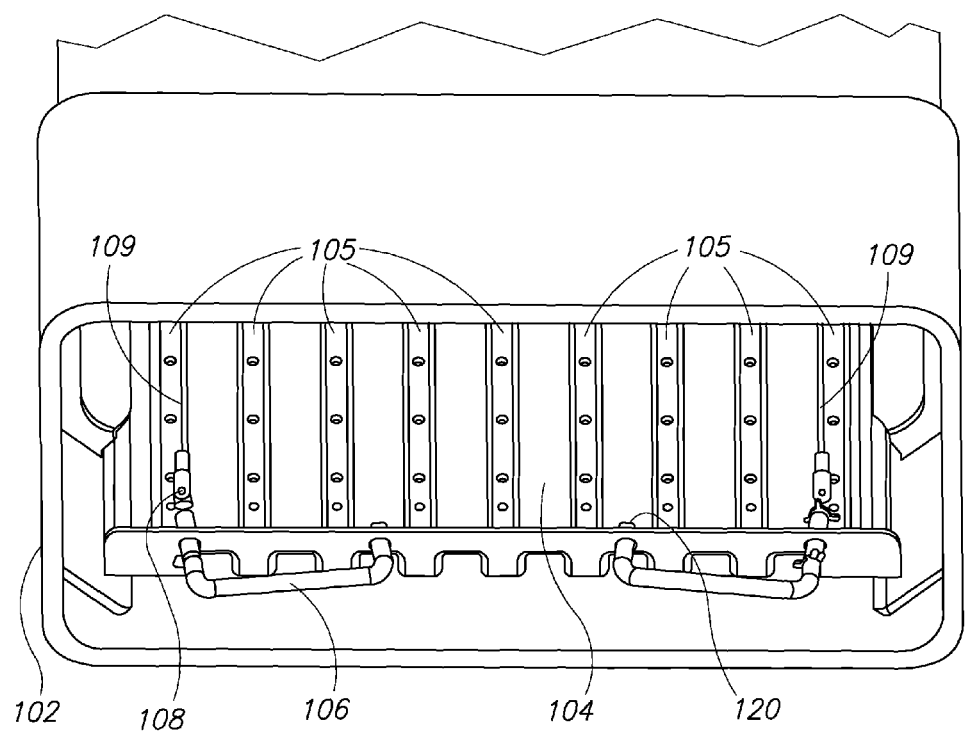
FIG. 2 shows a view from underneath an example rack mount case showing the underside of the slide-out platform and pull out handles.

FIG. 2 shows the rack mount case 102 and specifically shows an underside of the slide-out platform 104 and the pull out handles 106. The bottom of the slide-out platform 104 preferably includes a plurality of nut-bars 105 for attaching equipment. The nut-bars 105 are generally used to secure equipment to the platforms by means of screws or bolts.

Figure 3:
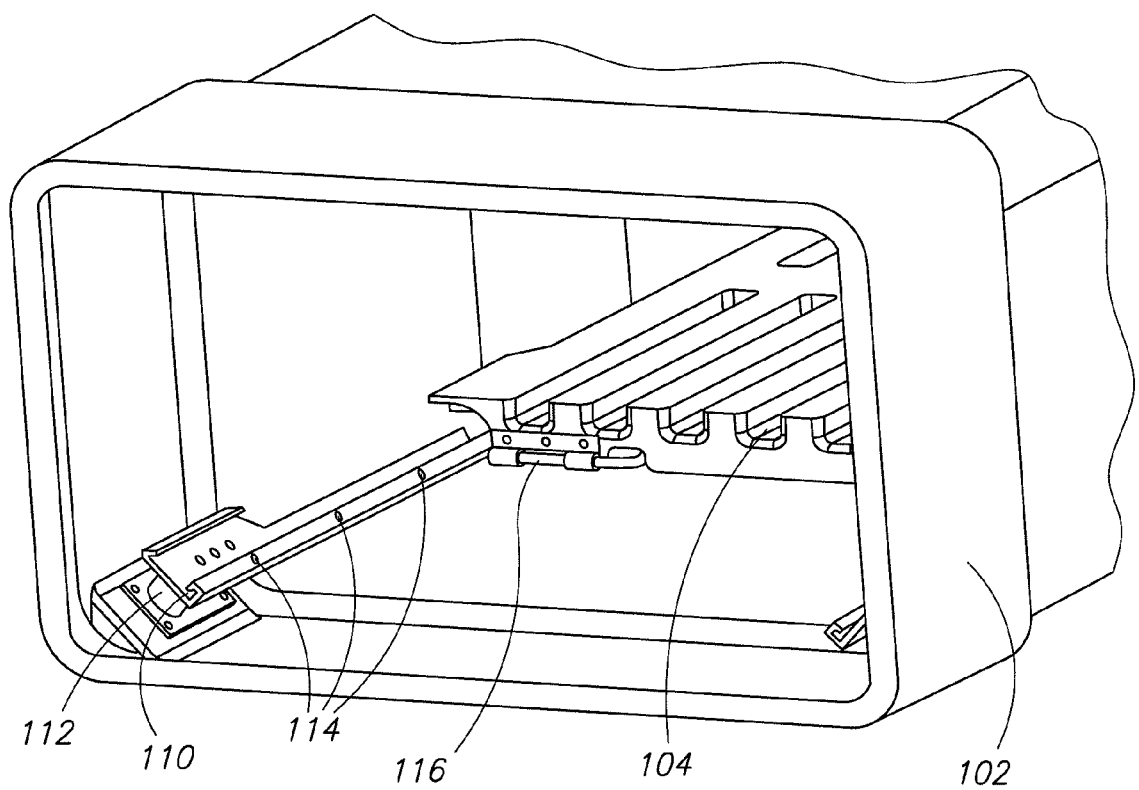
FIG. 3 shows a rear view of an example rack mount case with a slide-out platform in slide-out position.
Figure 5:
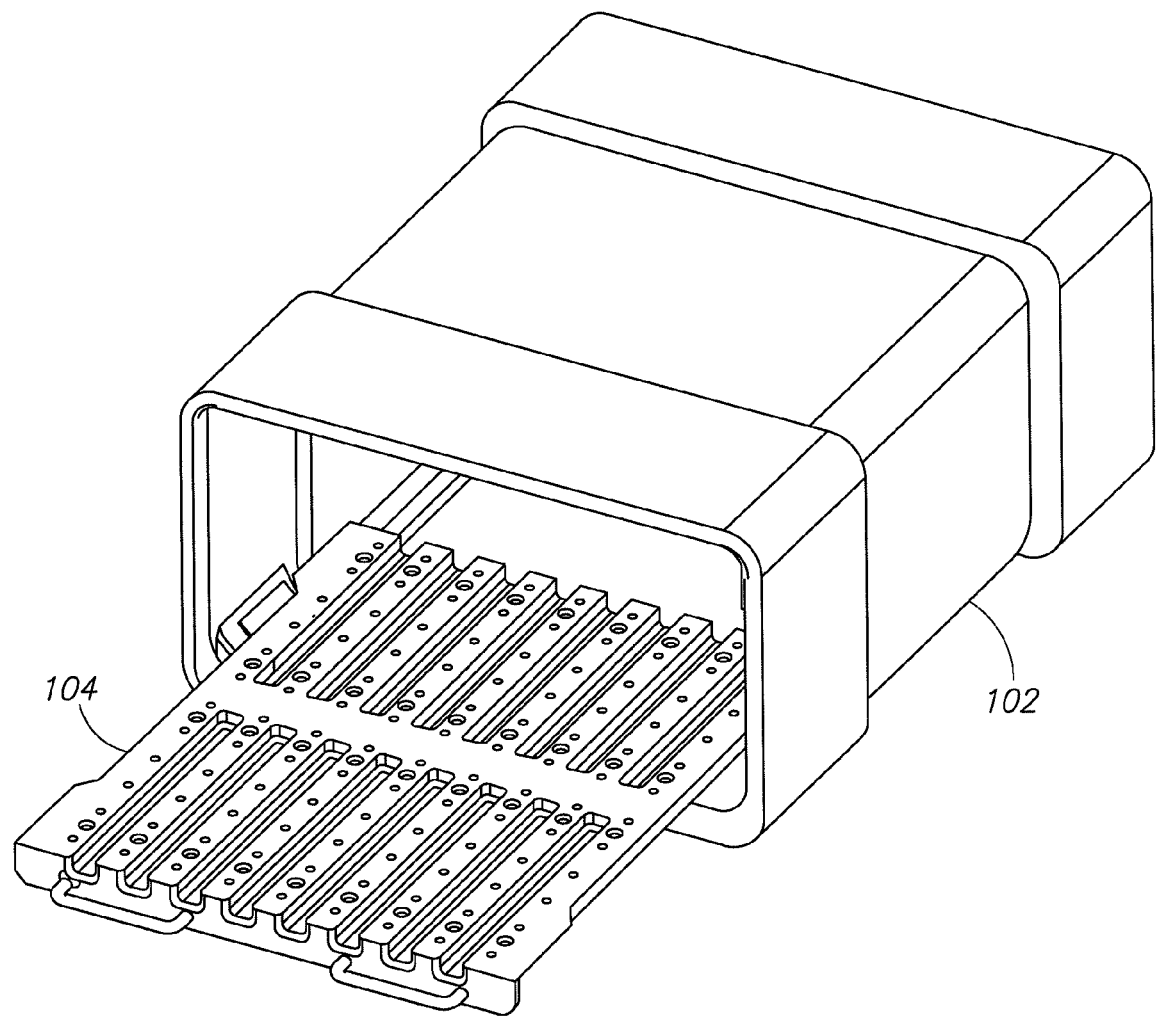
FIG. 5 shows an alternate view of an example rack mount case with an extended slide-out platform.

FIG. 3 shows a rear view of the rack mount case 102 with the slide-out platform 104. In one embodiment, the slide-out platform 104 is mounted on rails 110, which are mounted to a center body of the case using shock mounts 112. The platform 104 may be mounted on any form of rail system, sliding platform, wheels and/or bearings in alternate embodiments. The platform 104 is configured to lock into a stowed position on the rails 110 using rear retaining dagger pins 116 that are preferably operable from the front of the platform, but in alternate embodiment are operable from any location on the platform. The platform 104 may be configured to lock into a variety of positions, but in a preferred embodiment locks into three positions: fully stowed, one third extended, and two-thirds extended out of the front of the case body (FIG. 5). The dagger pins 108 engage the rails 110 at indexing holes 114 located on the rail 110 that are used to facilitate locking the platform at each of the plurality of positions. The rails are preferably shock mounted in order to provide shock and vibration protection for the platform 104 and any equipment located thereon. The shock mounts 112 may be made from rubber or other types of elastomeric materials having a desired durometer. In one embodiment, the material and geometry of the shock mounts 112 may be selected to obtain structural frequencies that minimize predetermined vibrational loads, inertial loads, or external loads.

Figure 4:
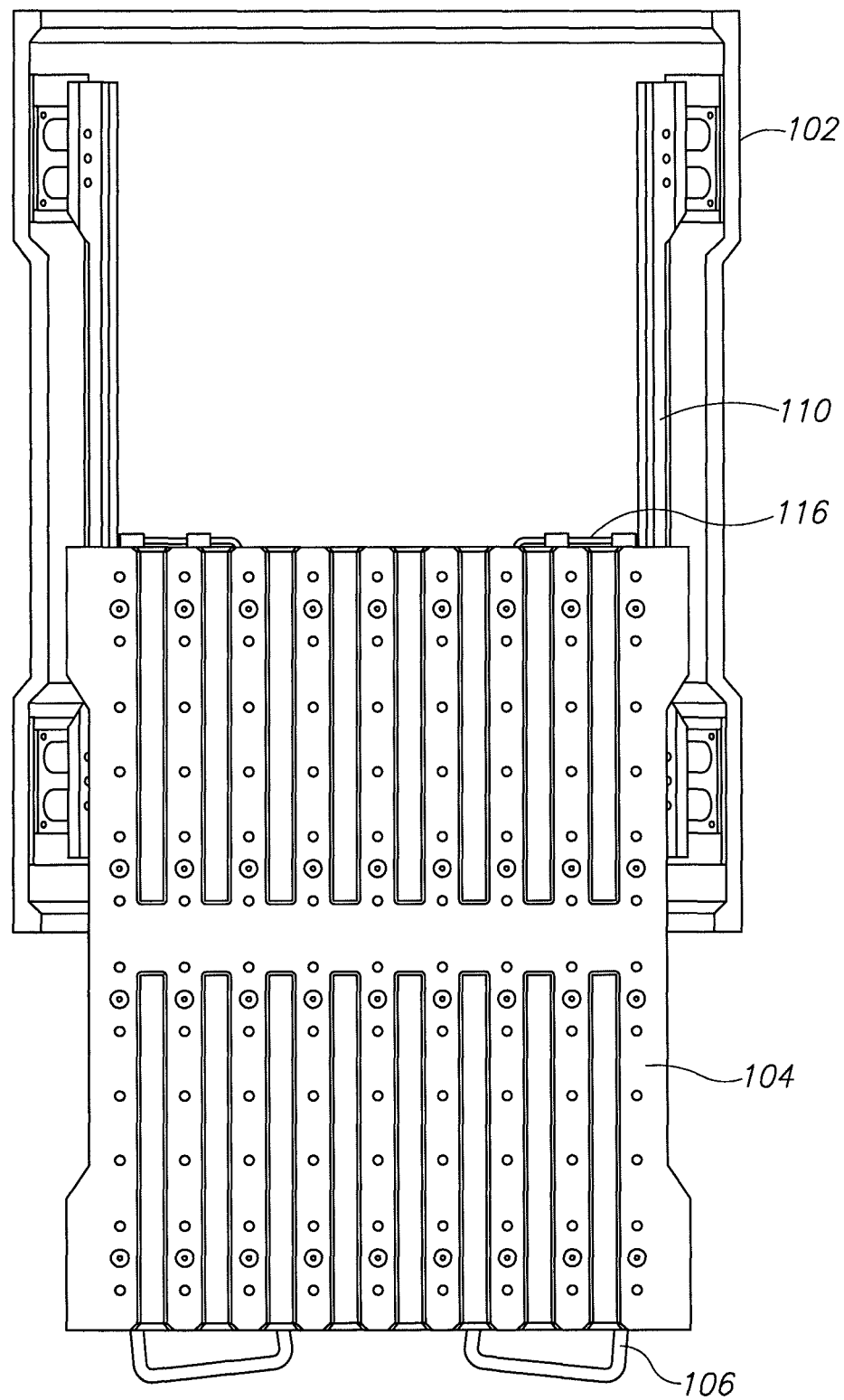
FIG. 4 shows a cross sectional view of an example rack mount case.

FIG. 4 shows a cross sectional view of the rack mount case 102, which includes the platform 104 extending from a front region of the case. The handles 106 are shown in an activated configuration to engage the rear retaining dagger pins 116, which in turn may be operated to successively engage the indexing holes (not shown) in the rail 110.

FIG. 5 shows the rack mount case 102 with the slide-out platform 104 extended to the ⅔ extension position as briefly described above.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

The embodiments of the invention in which an exclusive property or privilege is claimed are defined as follows:

1. A system for a slide-out platform in a rack mount case comprising:
    a slide-out platform configured to secure electronic equipment;
    a plurality of shock absorbent members coupled to the rack mount case with fasteners;
    a first rail and a second rail coupled to the shock absorbent members with fasteners and configured to slideably engage the slide-out platform, the first and second rails each having a plurality of indexing holes, wherein the shock absorbent members are configured to resist compression and tension loads between the rack mount case and the rails;
    at least one detent member coupled to the slide-out platform and movable for selected insertion into a desired indexing hole to substantially fix the slide-out platform relative to the case
    at least one handle engaged with the slide-out platform and coupled to the at least one detent member;
    wherein the at least one handle protrudes from a front surface of the slide-out platform; and
    wherein the at least one handle is translatably mounted within apertures defined by the front surface of the slide-out platform.

2. The system of claim 1, wherein the slide-out platform includes a top portion and a bottom portion with a plurality of openings extended through the platform from the top portion to the bottom portion.

3. The system of claim 2, wherein the bottom portion of the slide-out platform includes a plurality of elongated members.

4. The system of claim 1, wherein the first rail and the second rail are mounted at a forty five degree angle with respect to a vertical surface of the case.

5. The system of claim 1, wherein the at least one handle includes a biasing member to maintain the handle in engagement with the slide-out platform.

6. The system of claim 5, wherein the handle includes an end portion movable to urge the at least one detent member into the desired indexing hole.

7. The system of claim 1, wherein the at least one handle is located beneath an upper surface of the slide-out platform.

8. A system for a slide-out platform in a rack mount case comprising:
    means for attaching electronic equipment to the slideable platform in the rack mount case;
    means for slideably mounting the platform to the rack mount case;
    means for securing the platform to the means for slideably mounting within the rack mount case; and
    mounting means for coupling the means for slideably mounting fixedly and directly to the rack mount case,
    wherein the mounting means includes a plurality of shock absorbent members coupled between the rack mount case and the means for slideably mounting the platform to the rack mount case with fasteners, and
    wherein the mounting means is configured to resist a tension load between the rack mount case and the means for slideably mounting the platform to the rack mount case;
    wherein the means for slidably mounting the platform to the rack mount case includes first and second rails;
    at least one handle engaged with the platform and coupled to the means for securing;
    wherein the at least one handle protrudes from a front surface of the platform; and
    wherein the at least one handle is translatably mounted within apertures defined by the front surface of the platform.

9. The system of claim 8, wherein the means for slideably mounting are coupled to the rack mount case at a forty five degree angle from a vertical surface of the case.

10. The system of claim 8, wherein a selected movement of the at least one handle activates the means for securing.

11. A system for holding electronics equipment, the system comprising:
    an electronics stand configured to receive electronics equipment, the stand having a first rail and a second rail;
    a portable case having a case first rail and a case second rail configured to be in slideable engagement with the stand first rail and the stand second rail;
    at least one detent member coupled to the stand and receivable by an opening located in at least one of the case rails to affix the stand relative to the case, and
    a plurality of shock absorbent members coupled to the portable case and to the case first and second rails with a fastener configured to resist tension loading;
    at least one handle engaged with the electronics stand and coupled to the at least one detent member;
    wherein the at least one handle protrudes from a front surface of the electronics stand; and
    wherein the at least one handle is translatably mounted within apertures defined by the front surface of the electronics stand.

12. The system of claim 11, wherein the case rails are mounted at a forty five degree angle with respect to a vertical surface of the case.

13. The system of claim 11, wherein the at least one handle includes a biasing member to maintain the handle in engagement with the stand.

\* \* \* \* \*